(12) United States Patent
Clarke et al.

(10) Patent No.: US 7,586,214 B2
(45) Date of Patent: Sep. 8, 2009

(54) HIGH VOLTAGE ENERGY STORAGE CONNECTION MONITORING SYSTEM AND METHOD

(75) Inventors: Sean S. Clarke, Royal Oak, MI (US); Ronald J. Wiegand, Shelby Township, MI (US); Gery J. Kissel, Northville, MI (US); Jeffrey Johnson, Clarkston, MI (US); Ronald W. Young, Whittier, CA (US); James E. Tarchinski, Rochester Hills, MI (US); Paul E. Boskovitch, Shelby Township, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 351 days.

(21) Appl. No.: 11/548,317

(22) Filed: Oct. 11, 2006

(65) Prior Publication Data

US 2008/0092258 A1    Apr. 17, 2008

(51) Int. Cl.
*H01H 47/00* (2006.01)
(52) U.S. Cl. ..................................... 307/130

(58) Field of Classification Search .................. 307/130
See application file for complete search history.

(56) References Cited

U.S. PATENT DOCUMENTS 4,360,850 A * 11/1982 Howard et al. ................. 361/56
6,828,755 B1 * 12/2004 Iverson et al. ............... 320/104

* cited by examiner

*Primary Examiner*—Fritz M Fleming
*Assistant Examiner*—Dru M Parries

(57) ABSTRACT

A connection monitoring system and method for a vehicle high voltage energy storage system is disclosed. The method performs a check, at initial connection of the high voltage energy storage system, to insure that the vehicle high voltage wiring system is fully connected and without short circuits prior to allowing full current to the vehicle and normal vehicle operation. The method switches in a resistor to limit current flow between the high voltage energy storage system and the vehicle high voltage wiring, and measures the voltage and a voltage rise time across the resistor. The voltage and the voltage rise time across the resistor are used to determine if a short circuit is present, and if so the high voltage energy storage system is disconnected to protect the vehicle and its users.

18 Claims, 3 Drawing Sheets

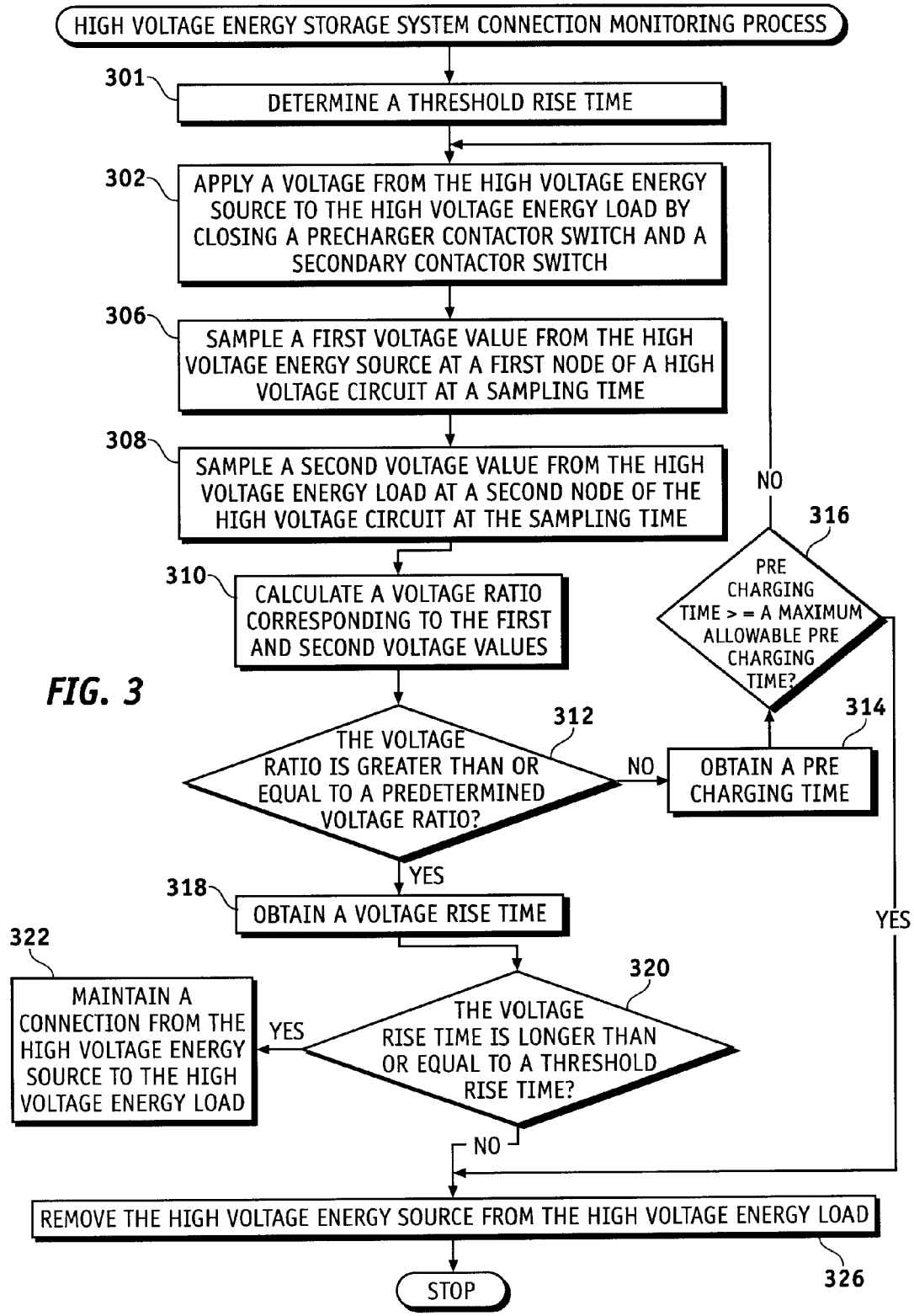

HIGH VOLTAGE ENERGY STORAGE CONNECTION MONITORING SYSTEM AND METHOD

TECHNICAL FIELD

Embodiments of the present invention relate generally to the electrical system of electrically assisted and powered vehicles such as gasoline-electric hybrid, pure electric, and fuel cell powered vehicles. More particularly, this invention relates to safety and system diagnostic monitoring of electrically assisted and powered vehicles.

BACKGROUND OF THE INVENTION

At present, automotive companies are increasing production of gasoline-electric hybrid vehicles, and research on pure electric and fuel cell powered vehicles. These electrically assisted and powered vehicles have the potential for reduced emissions, improved fuel economy, and enhanced performance. These advantages are possible because the electric component of the electric or hybrid engine allows near silent operation, precision control, added engine torque and power with a surge potential, and energy recovery from regenerative braking. With regard to regenerative braking, batteries and ultra-capacitors can be recharged, and fuel cell powered vehicles usually have battery or ultra-capacitor components.

Electrically assisted and powered vehicles generally disconnect the battery pack from the vehicle electrical wiring system when the vehicle is powered off. This serves a number of purposes, for example, isolation of the battery pack from the vehicle electrical loads to thereby reduce parasitic leakage current which drains the battery. Isolation also prolongs the storage of usable power and enhances battery cycle life. Since the battery system is high voltage, isolation furthermore prevents electrical hazards by powering down the myriad of wires and contacts that could be exposed.

The high voltage electrical system of these electrically assisted and powered vehicles can be divided into two main parts: the high voltage energy source including the batteries, ultra-capacitors, fuel cells, and battery pack controller; and the high voltage energy load including the electric motors, wiring, cables, electrical bus, electric coolers and heaters, connectors to the vehicle electrical system, voltage regulators, and many other electrical devices. Between the high voltage energy source and the high voltage energy load is a connection system that can be deactivated to isolate the high voltage energy source from the high voltage energy load.

The high voltage energy load could possibly become shorted to the vehicle body or another wire. In order to protect the vehicle and its users, it is desirable to have a high voltage system connection monitoring system that reliably protects against inadvertently putting full current through a short in the high voltage electrical bus. Other desirable features and characteristics of embodiments of the present invention will become apparent from the subsequent detailed description and the appended claims, taken in conjunction with the accompanying drawings and the foregoing technical field and background.

SUMMARY OF THE INVENTION

Systems and methods as described herein can be implemented in a vehicle to detect a disconnection in the vehicle high voltage energy load system. The technique performs a check, at initial connection of a high voltage energy source, to insure that a high voltage energy load in the high voltage electrical system is fully connected prior to allowing full current to the high voltage energy load and normal vehicle operation. The technique switches in a resistor to limit current flow between the high voltage energy source and the high voltage energy load, and measures voltage and voltage rise time across the vehicle load. The voltage and the voltage rise time across the vehicle load are used to determine if a disconnected vehicle load is present and, if so, the high voltage energy storage system is deactivated to protect the vehicle and its users.

The above and other aspects of the invention may be carried out in a first embodiment of the invention by monitoring a voltage ramp-up rate on a node for a high voltage energy load. In the first embodiment of the invention, a controller activates a precharge circuit to apply a voltage from the high voltage energy source to the high voltage energy load. The controller monitors a voltage ramp-up rate on a node on the high voltage energy load, and disconnects the high voltage energy source from the high voltage energy load if the voltage ramp-up rate is faster than a threshold rate. Otherwise normal operation of the vehicle may continue.

The above and other aspects of invention may be carried out in a second embodiment of the invention by monitoring a voltage rise and a voltage rise time from a node on a high voltage energy source to a node on a high voltage energy load. In the second embodiment of this invention, a controller determines the time for the voltage to rise to greater than or equal to a predetermined percent of the standard operating voltage. If the time is longer than or equal to a fastest allowable rise time for voltage measured at the high voltage energy load, then the voltage rise is normal. If the time is shorter than the fastest allowable rise time, then the rise is too fast implying a system failure.

DESCRIPTION OF THE DRAWINGS

A more complete understanding of the present invention may be derived by referring to the detailed description and claims when considered in conjunction with the following figures, wherein like reference numbers refer to similar elements throughout the figures.

FIG. 3 is a flow chart of the high voltage energy connection monitoring process for the high voltage energy storage system according to a second embodiment of the invention.

DESCRIPTION OF AN EXEMPLARY EMBODIMENT

Figure 1:
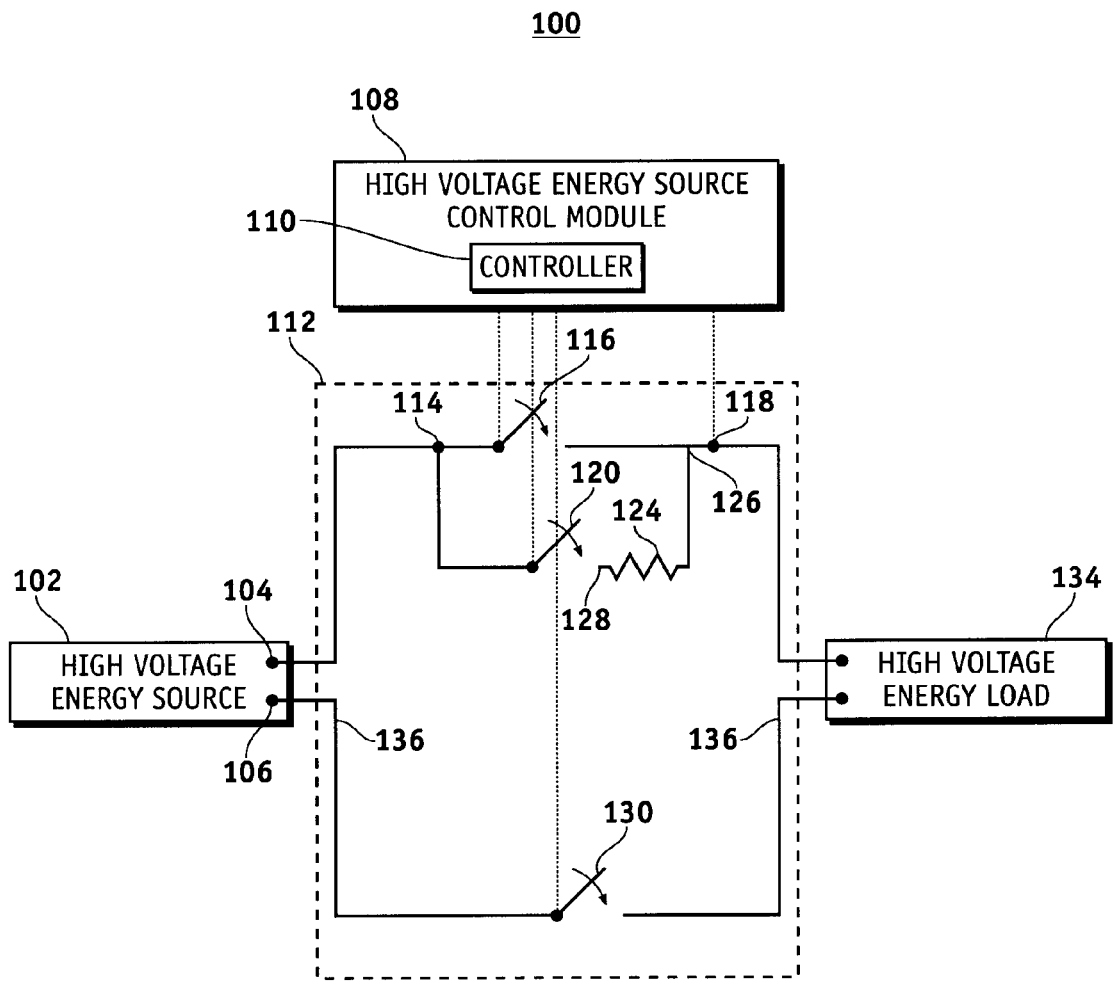
FIG. 1 is a schematic representation of a high voltage energy storage system according to an example embodiment of the invention.

The following detailed description is merely illustrative in nature and is not intended to limit the embodiments of the invention or the application and uses of such embodiments. Furthermore, there is no intention to be bound by any expressed or implied theory presented in the preceding technical field, background, brief summary or the following detailed description.

Embodiments of the invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g. memory elements, digital signal processing elements, logic elements, look-up tables, or the like, which may carry out a variety of functions under the control of one or more microprocessors or other control devices. In addition, those skilled in the art will appreciate that embodiments of the present invention may be practiced in conjunction with any number of vehicle applications and that the system described herein is merely one example embodiment of the invention.

For the sake of brevity, conventional techniques and components related to vehicle electrical parts and other functional aspects of the system (and the individual operating components of the system) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the invention.

The following description may refer to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the schematic shown in FIG. 1 depicts an example arrangement of elements, additional intervening elements, devices, features, or components may be present in an embodiment of the invention (assuming that the functionality of the system is not adversely affected).

Embodiments of the invention are described herein in the context of one practical application, namely, a connection monitoring technique for a high voltage energy storage system. In this context, the example technique is applicable to detecting circuit failures on the vehicle. Embodiments of the invention, however, are not limited to such vehicle applications, and the techniques described herein may also be utilized in other high voltage system connection monitoring systems.

FIG. 1 is a schematic representation of a high voltage energy storage system 100 that is suitably configured to perform a high voltage system connection monitoring process according to an example embodiment of the invention. The various blocks depicted in FIG. 1 may be realized by any number of physical components or modules located throughout the system 100. A practical high voltage energy storage system 100 may include a number of electrical components, circuits and controller units other than those shown in FIG. 1. Conventional subsystems, features, and aspects of the high voltage energy storage system 100 will not be described in detail herein.

High voltage energy storage system 100 generally includes a high voltage energy source 102, a high voltage energy source control module 108 including a controller 110, a high voltage circuit 112, and a high voltage energy load 134. In practice these elements may be coupled together using high voltage wires 136, cables, or the like.

In practical vehicle applications, the high voltage energy source 102 may be, without limitation: a battery pack, an ultra-capacitor, and/or a fuel cell. In this example embodiment, the high voltage energy source 102 is a battery pack having voltage, current, and other operating specifications that are suitable for the intended vehicle application. The high voltage energy source 102 may have wiring, cables, electrical buses, electric coolers and heaters (since performance may depend on temperature), connectors to the vehicle electrical system, voltage regulators, and many other electrical devices. As described below, the high voltage energy source 102 is suitably configured to supply a high voltage and/or a high voltage charge for the high voltage energy load 134.

The outputs from the high voltage energy source 102 are controlled by high voltage energy source control module 108, which is coupled to the high voltage circuit 112. The high voltage circuit 112 is utilized to apply the high voltage charge to the high voltage energy load 134. Briefly, the high voltage energy source control module 108 is configured to indicate a disconnection in the high voltage energy storage system 100 based upon a voltage rise time for the high voltage energy load 134, where the voltage rise time is measured in response to application of high voltage from the high voltage energy source 102 to the high voltage energy load 134.

The high voltage energy source control module 108 carries out the voltage monitoring functions and disconnection processes described herein. The high voltage energy source control module 108 may include any number of distinct processing modules or components that are configured to perform the tasks, processes, and operations described in more detail herein. Although only one control module 108 is shown in FIG. 1, a practical implementation may utilize any number of distinct physical and/or logical control modules, which may be dispersed throughout system 100. In practice, the control module 108 and/or controller 110 may be implemented or performed with a general purpose processor, a content addressable memory, a digital signal processor, an application specific integrated circuit, a field programmable gate array, or any suitable programmable logic device, discrete gate or transistor logic, discrete hardware components, or any combination thereof, designed to perform the functions described herein. The control module 108 and/or the controller 110 may be realized as a microprocessor, a microcontroller, or a state machine.

In this example, the high voltage circuit 112 comprises a primary contactor switch 116, a precharge contactor switch 120, a precharge resistor 124, and a secondary contactor switch 130. These components may be coupled together in the example arrangement shown in FIG. 1.

Primary contactor switch 116 is coupled to a first pole 104 of the high voltage energy source 102. When closed, primary contactor switch 116 connects first pole 104 to the high voltage energy load 134. In this manner, primary contactor switch 116 is configured to control full current flow to the high voltage energy load 134. The primary contactor switch 116 may be closed by the high voltage energy source control module 108 to allow operation of the high voltage energy source 102 with the vehicle.

Precharge resistor 124 has a first end 126 coupled to the high voltage energy load 134 and a second end 128 that is coupled to first pole 104 when precharge contactor switch 120 is closed. Precharge resistor 124 is suitably configured to allow a relatively slow charging of the capacitance on the high voltage energy load 134.

Precharge contactor switch 120 is coupled between the first pole 104 of the high voltage energy source 102 and the second end 128 of the precharge resistor 124. When precharge contactor switch 120 is closed, it introduces precharge resistor 124 into the path between first pole 104 and high voltage energy load 134. Thus, the precharge contactor switch 120 is configured to control current flow to high voltage energy load 134 through the precharge resistor 124. The precharge contactor switch 120 may be closed by the high voltage energy source control module 108 before closing the primary contactor switch 116 to allow the precharging operation described below in conjunction with FIGS. 2 and 3.

Secondary contactor switch 130 is coupled to a second pole 106 of the high voltage energy source 102. When closed, secondary contactor switch 130 couples second pole 106 to the high voltage energy load 134. Thus, secondary contactor switch 130 is suitably configured to control current flow to the high voltage energy load 134. The secondary contactor switch 130 is closed by the high voltage energy source control module 108 in conjunction with the primary contactor switch 116 and/or the precharge contactor switch 120 in order to complete or disconnect the high voltage circuit.

The high voltage energy load 134 may have electric motors, wiring, cables, electrical bus, electric coolers and heaters, connectors to the vehicle electrical system, voltage regulators, and many other electrical devices. In practice, the high voltage energy load 134 may have significant capacitance.

The high voltage connection monitoring system 100 may be run every time the high voltage energy source 102 is connected to the vehicle, for example, when the ignition is turned on. The system performs a check, at initial connection of the high voltage energy source 102, to insure that the high voltage energy load 134 in system 100 is fully connected and without short circuits prior to allowing full current flow to the high voltage energy load 134 and normal vehicle operation. The method described herein switches in the precharge resistor 124 to limit current flow between the high voltage energy source 102 and the high voltage energy load 134, and the secondary contactor switch 130, then measures the voltage across the high voltage energy load 134. The voltage across the high voltage energy load 134 is used to determine if a short circuit, or a disconnected circuit is present and, if so, the high voltage energy storage system is disconnected to protect the vehicle and its users.

Figure 2:
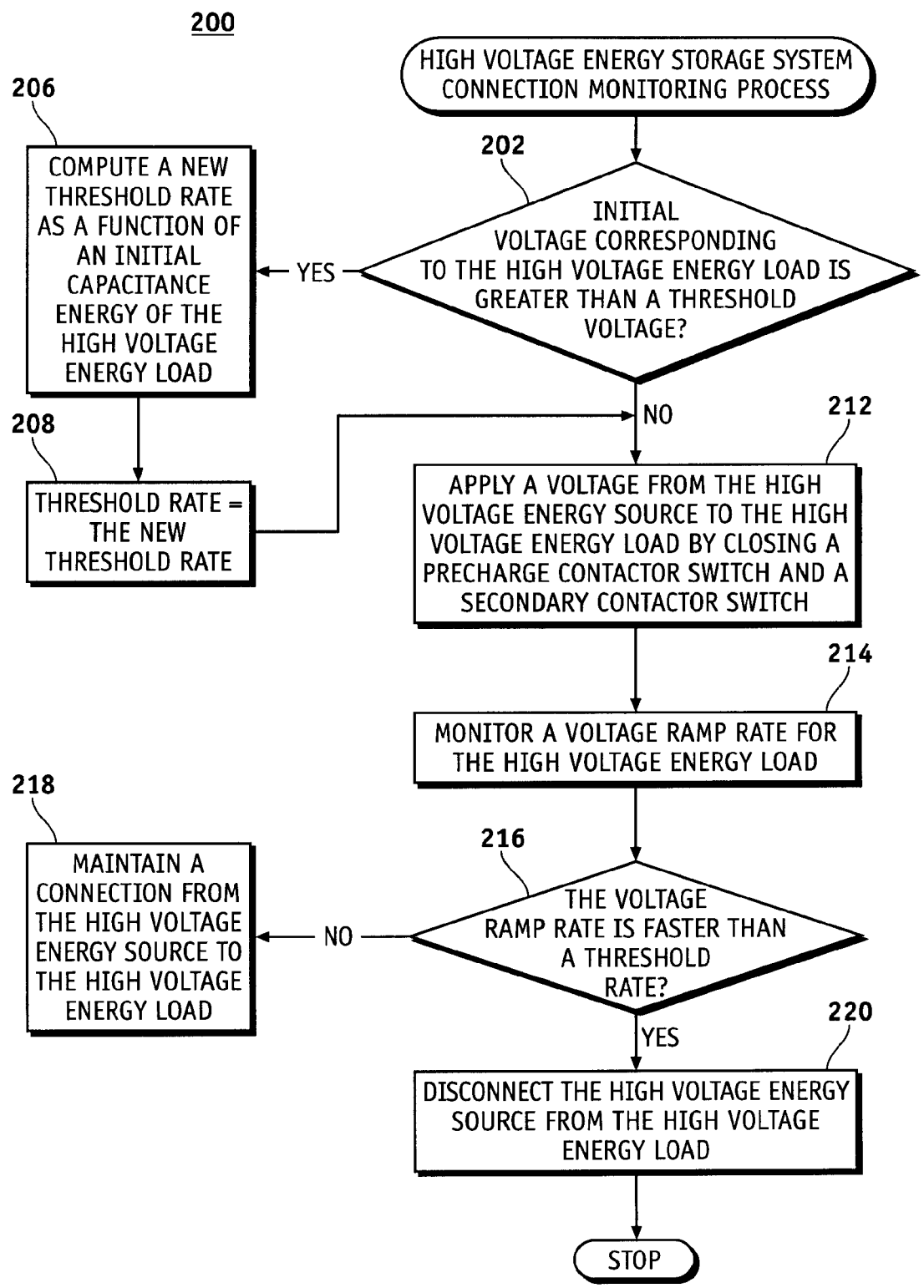
FIG. 2 is a flow chart of a high voltage energy connection monitoring process for the high voltage energy storage system according to a first embodiment of the invention.

FIG. 2 is a flow chart of the high voltage energy connection monitoring process 200, which may be performed by the system 100 as described above. Process 200 detects a disconnection in system 100 by monitoring a voltage ramp rate from a high voltage energy source to a high voltage energy load. The various tasks performed in connection with process 200 may be performed by software, hardware, firmware, or any combination thereof. For illustrative purposes, the following description of process 200 may refer to elements mentioned above in connection with FIG. 1. In practical embodiments, portions of process 200 may be performed by different elements of the system 100, e.g. the high voltage energy source control module 108, and the high voltage circuit 112.

The high voltage energy connection monitoring process 200 may begin by checking for any initial voltage in the high voltage energy load 134 (inquiry task 202). This check for the initial voltage is performed because capacitance of the high voltage energy load 134 may have accumulated energy during prior connection attempts. If there is already accumulated energy on the high voltage energy load 134, less current and time are necessary to raise the voltage on the high voltage energy load 134. Normally when the high voltage energy load 134 is disconnected from the high voltage energy source 102, there may still be capacitance energy in components of the high voltage energy load 134 that stay charged for a certain amount of time until discharged fully. The next time the vehicle ignition is turned on, the system will measure how much voltage is already present across the high voltage energy load 134, and perform its calculation based on the available capacitance energy. As a result, it may take less time to charge the capacitance when there is some capacitance energy still left. It takes, for example, approximately 10 ms for every 100 volts. The calibrated time is not changed, but the method is adjusted for a quicker time when some capacitance energy is already available. For example, if there are 100 volts already on the system, it would take less time to precharge an additional 200 volts than to precharge a full 300 volts from zero volts.

The initial voltage corresponding to the high voltage energy load 134 is checked to determine whether it is greater than a threshold voltage (inquiry task 202). The threshold voltage is set to a level such that any amount of voltage above the threshold voltage will cause an error in the voltage ramp rate. The threshold voltage value may be different for different vehicles. If the controller 110 determines that the initial voltage corresponding to the high voltage energy load 134 is greater than the threshold voltage (inquiry task 202) then process 200 may proceed to compute a new threshold rate as a function of an initial capacitance energy of the high voltage energy load 134 (task 206) and resume operation by replacing the threshold rate with the new threshold rate (task 208). This task is performed to determine the threshold rate corresponding to a voltage ramp rate across the high voltage energy load 134, as a function of the initial capacitance energy of the high voltage energy load 134. The voltage rise time may be inversely proportional to the initial capacitance energy value accumulated in the high voltage energy load 134. For example, the threshold rate may be based upon a fastest allowable voltage rise time for voltage across the high voltage energy load 134 (which may be about 20, 30 or 40 ms if there is no initial accumulated capacitance energy in the high voltage load 134). The fastest allowable voltage rise time may be calibrated for each vehicle design and may be fixed for each vehicle. However, the fastest allowable voltage rise time may be effected by existence of an initial capacitance energy. For example, if the electrical connector to the high voltage energy load 134 is disconnected the effective capacitance of the high voltage energy load 134, with respect to the high voltage energy source 102, is zero. Therefore, when the precharge contactor switch 120 and the secondary contactor switch 130 are closed there will be, for example, about 300 volts on the high voltage energy load 134 almost immediately. The threshold rate may also be a function of a variable vehicle configuration as explained in the context of FIG. 3 below.

If the initial voltage corresponding to the high voltage energy load 134 is not greater than the threshold voltage (task 202), process 200 may proceed to initiate the high voltage precharging process without replacing the threshold rate by the new threshold rate.

Process 200 then proceeds to initiate the precharging process by closing the precharge contactor switch 120 thereby connecting the precharging resistor 124 between the high voltage energy source 102 to the high voltage energy load 134 and closing the secondary contactor switch 130 to complete a circuit. This procedure causes a voltage to be applied from the high voltage energy source 102 to the high voltage energy load 134 (task 212).

Process 200 then proceeds to monitor the voltage ramp rate for the high voltage energy load 134 (task 214). The controller 110 measures the voltages and sampling times across the high voltage energy load 134 at nodes 118 and 136 of circuit 112 to determine whether the voltage ramp rate is faster than the threshold rate (inquiry task 216). If the voltage ramp rate is not faster than the threshold rate, then the high voltage energy source 102 maintains a connection to the high voltage energy load 134 (task 218). Once the voltage at high voltage energy load 134 reaches a specified value (for example, about 95% of the high voltage energy source 102), the precharging is complete and at that time the primary contactor 116 may be thrown to apply the whole voltage. However, if the voltage ramp rate is faster than the threshold rate, (i.e., the system precharges too fast), then the high voltage energy source 102 is disconnected from the high voltage energy load 134 (task 220) and the process stops. At this point, controller 110 may command all switches 116, 120, 130 to open to remove the high voltage from the high voltage energy load 134. In addition, process 200 may deactivate the connection system, disabling the high voltage system, if the voltage ramp rate is too slow (this process is not shown in FIG. 2, but is expanded upon in FIG. 3.)

FIG. 3 is a flow chart of a second embodiment of the high voltage energy disconnection detection process 300 that may be performed by the system 100 as described above. Process 300 detects a disconnection in system 100 by monitoring a voltage ratio and a voltage rise time from the high voltage energy source 102 to the high voltage energy load 134. The various tasks performed in connection with process 300 may be performed by software, hardware, firmware, or any combination thereof. For illustrative purposes, the following description of process 300 may refer to elements mentioned above in connection with FIG. 1. In practical embodiments, portions of process 300 may be performed by different elements of connection monitoring system 100, e.g., the high voltage energy source control module 108, and the high voltage circuit 112.

The connection monitoring process 300 may begin by determining a threshold rise time. The threshold rise time may be determined, without limitation, by a fixed system method, by a dynamic system method or by a variable vehicle configuration method as explained below.

In the fixed system method, the threshold rise time is calibrated and embedded in the controller 110. In the fixed system method, the controller monitors the voltage rise time across the high voltage energy load 134, relative to a fixed threshold rise time value each time system 100 is powered up (as described above), and system 100 does not update the threshold rise time after power up.

In the dynamic system method, the controller 110 may start with a threshold rise time calibration programmed in the controller 110. In this case system 100 may update the threshold rise time calibration based on the resulting charging time each time system 100 operates. An example of the need for the dynamic system method is to compensate for component degradation over time.

In the variable vehicle configuration the controller 110 may calculate a threshold rise time calibration based upon a current vehicle configuration. For example, there may be high voltage devices which may be connected to the high voltage energy storage system 100 for certain time periods and disconnected at other times. A plug in hybrid would be an example, where the current vehicle configuration would change because when plugged in an additional (energy source/capacitive load) is added through circuitry to the (high voltage energy source 102/high voltage energy load 134) changing the precharge time.

After determining a threshold rise time (task 301), process 300 will then continue initiating a precharging process by closing the precharge contactor switch 120 and the secondary contactor switch 130. This causes a high voltage to be applied from the high voltage energy source 102 to the high voltage energy load 134 (task 302) as explained in the context of FIG. 2.

Next, process 300 samples (at a particular sampling time) a first voltage value from the high voltage energy source 102 at the first node 114 of the high voltage circuit 112, relative to node 136 (task 306). The process concurrently samples (at the same sampling time) a second voltage value from the high voltage energy load 134 at a second node 118 of the high voltage circuit 112, relative to node 136 (task 308). In the example embodiment, the sampling of these voltages is managed by controller 110.

Process 300 then proceeds to calculate a voltage ratio from the first and the second voltage values (task 310) and checks to determine whether the voltage ratio is greater than or equal to a predetermined voltage ratio (inquiry task 312). The voltage ratio for this example embodiment is, without limitation, the second voltage value sampled at node 118 of the circuit 112 divided by the first voltage value sampled at the node 114 of the circuit 112, which indicates a percentage of the high voltage energy load 134 relative to the high voltage energy source 102 voltage. Other ratios may also be used. If there is no short circuit draining current from the high voltage energy load 134, after a short time, the voltage ratio should exceed a value specific to the particular vehicle. The predetermined voltage ratio may be, without limitation, about 95 percent and it represents a voltage ratio between the voltages at node 114 and node 118 across the precharge resistor 124 of circuit 112 relative to node 130 as explained above. This ratio is used to determine when to close the primary contactor. Closing the primary contactor into a predominately discharged high voltage capacitive load could damage the components of the capacitive load. At 95 percent, the inrush current into the capacitive load from closing the primary contactor is sufficiently reduced.

If the voltage ratio is greater than or equal to the predetermined voltage ratio then task 300 proceeds to obtain a voltage rise time (task 318). The voltage rise time is measured by the controller 110 from the time of first closure of precharge switch 120 until the voltage on node 118 reaches the predetermined voltage ratio, which is nominally 0.95 in this example. The voltage rise time may be, without limitation, about 20, 30 or 40 ms if there is no initial accumulated capacitance energy in the high voltage load 134 as explained above in the context of FIG. 2. The precharge current through the precharge resistor 124 will charge the capacitance of the high voltage energy load 134 in a time period called a precharging time. A threshold rise time is set to a level that exceeds a maximum allowable precharging time even including component and performance variation. If a circuit failure is present, the leakage current will drain current from the high voltage energy load 120, and reduce the net current charging the capacitance of the high voltage energy load 134. The reduced current will extend the voltage rise time. A voltage rise time that exceeds the threshold rise time indicates a circuit failure, leakage current or short circuit.

Process 300 may then proceed to inquire whether the measured voltage rise time is longer than or equal to the threshold rise time (inquiry task 320). If process 300 determines that the voltage rise time is longer than or equal to the threshold rise time, then process 300 does not disconnect the high voltage energy source 102 from the high voltage energy load 134, and the vehicle continues its normal operation (task 322). However, if the voltage rise time is shorter than the threshold rise time, then process 300 removes the high voltage energy source 102 from the high voltage energy load 134 (task 326).

Following the inquiry task 312, if process 300 determines that the voltage ratio is less than the predetermined voltage ratio, then process 300 proceeds to obtain the precharging time (task 314). If the precharging time is greater than or equal to a maximum allowable precharging time (indicating the system 100 is precharging too slowly) (inquiry task 316), then process 300 proceeds to task 326 to remove the high voltage energy source 120 from the high voltage energy load 134. This is because exceeding the precharging time may also be indicative of a circuit failure since the threshold rise time is set to a level that exceeds a maximum allowable precharging time as explained above. The maximum allowable precharging time is nominally 450 milliseconds. Other maximum allowable precharging times may also be used depending on the vehicle. Maximum precharge times are dependant upon vehicle configuration and the number of high voltage energy loads. The more high voltage electrical components on the high voltage bus, the greater the capacitance to charge, and the longer allowable precharge time. As a rule of thumb, a system is designed to take no longer than 500 ms to charge. If inquiry task 316 determines that the measured precharging time is less than the maximum allowable precharging time, then process 300 continues sampling the voltage values across the precharging resistor 124 by leading back to task 306.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention, where the scope of the invention is defined by the claims, which includes known equivalents and foreseeable equivalents at the time of filing this patent application.

What is claimed is:

1. A connection monitoring method for a vehicle having a high voltage energy source and a high voltage energy load, the method comprising:
   applying a voltage from the high voltage energy source to the high voltage energy load;
   monitoring a voltage ramp rate for the high voltage energy load; and
   disconnecting the high voltage energy source from the high voltage energy load if the voltage ramp rate is faster than a threshold rate, wherein the threshold rate is a function of an initial capacitance energy for the high voltage energy load, and the initial capacitance energy is accumulated in response to a prior charge attempt by the high voltage energy source.

2. A method according to claim 1, further comprising maintaining a connection from the high voltage energy source to the high voltage energy load if the voltage ramp rate is not faster than the threshold rate.

3. A method according to claim 1, wherein the high voltage energy source comprises a high voltage battery pack.

4. A method according to claim 1, wherein the high voltage energy load comprises a high voltage electronic bus for the vehicle.

5. A method according to claim 1, wherein the high voltage energy load is capacitive.

6. A method according to claim 1, wherein the threshold rate is based upon a fastest allowable rise time for voltage across the high voltage energy load.

7. A method according to claim 1, further comprising disabling the vehicle if the voltage ramp rate is faster than the threshold rate.

8. A connection monitoring method for a high voltage energy storage system having a high voltage circuit, a high voltage energy source, and a high voltage energy load, the method comprising:
   applying a high voltage from the high voltage energy source to the high voltage energy load;
   sampling a first voltage value from the high voltage energy source at a first node of the high voltage circuit at a sampling time;
   sampling a second voltage value from the high voltage energy load at a second node of the high voltage circuit at the sampling time;
   calculating a voltage ratio from the first and the second voltage values;
   obtaining a voltage rise time when the voltage ratio is greater than or equal to a predetermined voltage ratio; and
   removing the high voltage energy source from the high voltage energy load if the voltage rise time is shorter than a threshold rise time.

9. A method according to claim 8, further comprising determining the threshold rise time.

10. A method according to claim 9, wherein the threshold rise time is a function of a high voltage energy load configurations for a vehicle.

11. A method according to claim 9, wherein the threshold rise time is based on a fastest allowable rise time for voltage across the high voltage energy load.

12. A method according to claim 11, wherein the fastest allowable rise time is a function of an initial capacitance energy for the high voltage energy load, and the initial capacitance energy is accumulated in response to a prior charge attempt by the high voltage energy source.

13. A method according to claim 8, further comprising disabling the high voltage system in response to the removing step.

14. A method according to claim 8, wherein the predetermined voltage ratio is nominally 0.95 percent.

15. A method according to claim 8, further comprising:
   obtaining a precharging time if the voltage ratio is less than the predetermined voltage ratio; and
   removing the high voltage energy source from the high voltage energy load if the precharging time is greater than or equal to a maximum allowable precharging time.

16. A method according to claim 15, wherein the maximum allowable precharging time is nominally 450 milliseconds.

17. A high voltage connection monitoring system for a vehicle, the system comprising:
   a high voltage energy source configured to supply a high voltage charge for a high voltage energy load on the vehicle;
   a high voltage circuit configured to apply the high voltage charge to the high voltage energy load; and
   a high voltage energy source control module coupled to the high voltage circuit and configured to remove a high voltage energy storage system based upon a voltage rise time for the high voltage energy load, the voltage rise time being measured in response to application of a high voltage from the high voltage energy source to the high voltage energy load, the high voltage energy source control module being configured to:
      apply the high voltage from the high voltage energy source to the high voltage energy load;
      sample a first voltage value from the high voltage energy source at a first node of the high voltage circuit at a sampling time;

sample a second voltage value from the high voltage energy load at a second node of the high voltage circuit at the sampling time;

calculate a voltage ratio from the first and the second voltage values;

obtain a voltage rise time when the voltage ratio is greater than or equal to a predetermined voltage ratio; and remove the high voltage energy source from the high voltage energy load if the voltage rise time is shorter than a threshold rise time.

18. A system according to claim 17, wherein the high voltage circuit further comprises:

a primary contactor switch coupled to a first pole of the high voltage energy source and configured to control current flow to the high voltage energy load;

a precharge resistor having a first end coupled to the high voltage energy load;

a precharge contactor switch, coupled between the first pole of the high voltage energy source and a second end of the precharge resistor, the precharge contactor switch being configured to control current flow to the precharge resistor; and a secondary contactor switch coupled to a second pole of the high voltage energy source and configured to control current flow to the high voltage energy load.

* * * * *